United States Patent [19]
Sherman

[11] Patent Number: 4,970,690
[45] Date of Patent: Nov. 13, 1990

[54] MEMORY CELL ARRANGEMENT SUPPORTING BIT-SERIAL ARITHMETIC

[75] Inventor: David Sherman, Fremont, Calif.

[73] Assignee: Atari Games Corporation, Milpitas, Calif.

[21] Appl. No.: 388,082

[22] Filed: Jul. 31, 1989

[51] Int. Cl.[5] ............................................. G11C 7/00
[52] U.S. Cl. ............................ 365/189.02; 365/219
[58] Field of Search .............. 365/189.02, 230.02, 365/193, 194, 233, 238.5, 219, 220, 221

[56] References Cited

U.S. PATENT DOCUMENTS

| | | | |
|---|---|---|---|
| 4,435,792 | 3/1984 | Bechtolsheim | 365/189.02 |
| 4,685,088 | 8/1987 | Iannucci | 365/230.02 |

*Primary Examiner*—Joseph A. Popek
*Attorney, Agent, or Firm*—Ronald C. Fish

[57] ABSTRACT

A memory cell and array of memory cells specially adapted for support of bit serial math for low cost CAD workstations. The memory cell is comprised of a multiplexer which selects between several inputs for application of data to a bit storage cell of a dynamic RAM nature. Each cell multiplexer has a serial data input, a parallel data input, a parallel format pipeline data input and a recirculation data input. Each cell also has a first output which serves both as a serial data output and a pipeline data output, and a second data output which is tri-state and which is coupled to a parallel format data bus which runs through the array. A plurality of such cells are arranged in rows and columns where rows of such cells are coupled so that data may passed between the rows in either parallel format or serial format for pipeline operations and such each row can independently load data in either serial or parallel format and output data in either parallel or serial format. Ech cell has a selectable recirculation path which allows any cell or group of cells to be used as RAM or as a shifting network.

18 Claims, 5 Drawing Sheets

MEMORY CELL ARRANGEMENT SUPPORTING BIT-SERIAL ARITHMETIC

BACKGROUND OF THE INVENTION

The invention pertains to memory cells and arrays of memory cells which are particularly well suited to support bit serial arithmetic.

Bit serial arithmetic is useful for integrated circuit design in many applications, including CAD applications. This is because bit serial math circuitry takes up less space on an integrated circuit die. Such circuitry requires support circuitry which can do various data storage and manipulation functions in order to interface properly with other systems such as computer-aided design software. Such functions include parallel-to-serial and serial-to-parallel data format conversion, pipeline data storage, variable-length delays for various data words to insure synchronization with operations by other portions of the bit serial circuitry, or combinations of the above-noted functions.

The prior art includes universal shift registers which can do some subset of the required functions to support operations by bit serial arithmetic such as parallel-to-serial conversion and serial-to-parallel conversion. Also, delay lines are known for performing synchronization functions. However, no circuitry exists which can perform all of the support functions necessary to perform bit serial arithmetic.

Accordingly, a need has arisen for a new type of memory cell and a new arrangement of memory cells which can be operated to provide the necessary support functions for pipelined bit serial arithmetic.

SUMMARY OF THE INVENTION

In accordance with the teachings of the invention, there is disclosed herein a specially adapted apparatus for storing data comprising a memory cell which stores one bit of digital data combined with a multiplexer and an output enable circuit. The memory cell has one input and two outputs. The memory cell can be of a dynamic RAM nature in that data is stored temporarily on a capacitor, which, in integrated format, can be the node capacitance of an internal integrated line coupled to the input gates of a clocked inverter which drives one of the outputs.

The multiplexer has an output which is coupled to the input of the memory cell and has multiple inputs for receiving data from multiple sources. One of these sources is the memory cell itself. Each memory cell multiplexer has a serial data input for receiving data in a serial bit stream and a parallel data input for receiving one bit from one wire of a parallel bus. Each multiplexer also has a recirculation data input which is coupled to one of the data outputs of the memory cell. Finally, each multiplexer has a pipeline data input for receiving one bit of a parallel data transfer from the pipeline data output from the cell in the same column in the row above. The first output of each memory cell serves as both the serial data format output and the pipeline output.

Each row of the array can serve as a stage of a pipeline. Control circuitry exists coupled to the first and last cell in every row which can operate to create multiple pipelines of different lengths where each stage in the pipeline can be one or more rows. The pipeline output of each cell allows parallel transfers of data between rows of the array in accordance with conventional pipeline operational concepts.

In accordance with the teachings of the invention, an array of the above-described data cells is formed having a plurality of rows and columns. Each row has a plurality of data storage cells which store one word or a portion of one word. Each memory cell's two outputs will hereafter be designated as Q and Z. The Q output is coupled to the serial data input of the multiplexer of the neighboring data cell on the right (or the left) in the row. Each Q output of each cell is also coupled to the recirculation input of that cell's multiplexer such that data may be recirculated and thereby saved by a refreshing action where the data storage cell is of a dynamic nature. Note that the recirculation signal line allows any cell or group of cells to be used essentially as RAM or a shifting network with variable delay. This connection is unnecessary where the data storage cell is of a static RAM cell design. The pipeline data input of the multiplexer of each cell is coupled to the Q output of the corresponding cell, i.e., the same column, of the row above in the array.

The Z output of every cell is connected to a parallel bus which runs throughout the array. This bus has as many data lines as there are columns in the array. Each column line is connected to the parallel data input of each multiplexer of each cell in the corresponding column. In other words, if there are sixteen cells in a row, the parallel data bus has 16 lines with line 0 connected to the parallel data input of the multiplexer of cell 0 of each row and line 1 connected to the parallel data input of the multiplexer of cell 1 in each row, and so on for all 16 lines.

Each Z output of each cell is controlled by a tri-state circuit which, when a tri-state control signal is activated, electrically couples the Z output to the corresponding line of the parallel data bus.

DETAILED DESCRIPTION OF THE PREFERRED EMBODIMENT

Figure 1:
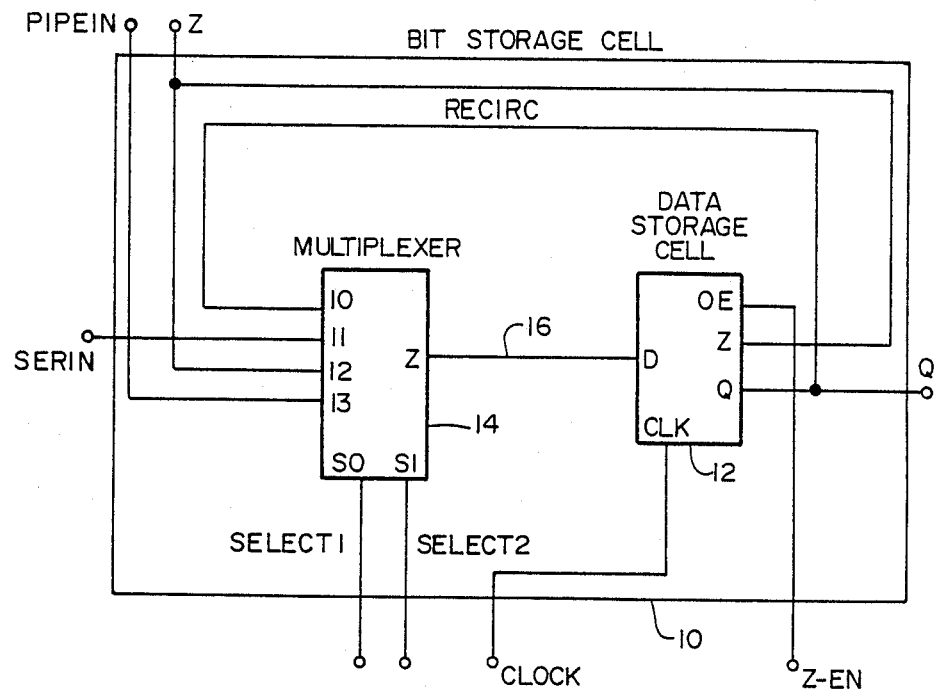
FIG. 1 is a block diagram of a single bit storage cell according to the teachings of the invention.

Referring to FIG. 1, there is shown a block diagram of a generic form of the memory cell according to the teachings of the invention. A plurality of these cells can be combined into an array with multiple rows and columns in such a manner as to support various data manipulations and functional capabilities necessary for bit serial arithmetic.

Each cell is comprised of a data storage cell 12 and a multiplexer 14 plus various interconnections between these two circuits.

The data storage cell 12 can be either a static RAm cell type of design or a dynamic RAM cell type of design. A dynamic type of cell has been selected for illustration here. The data storage cell 12 stores one bit of binary data received at the D input and presents this data at each of two outputs labeled Z and Q. The Z output is a tri-state output which can be electrically isolated such that the data stored in the cell will not drive any bus line connected to the Z output unless a control signal Z-EN is active. The data storage cell 12 also receives a clock signal which controls the loading of data from line 16 into the data storage cell and the outputting of data stored in the cell to the Q and Z outputs.

The multiplexer 14 has several data inputs marked I0, I1, I2 and I3. The mulitplexer also has two inputs marked S0 and S1 for receiving input select control signals designated SELECT1 and SELECT2. These two select signals have binary states which define four distinct possibilities for selection of one of the outputs I0-I3 for connection to the line 16. When the control signals SELECT1 and SELECT2 are both 0, then the recirculation data input I0 is coupled to the line 16. This causes the data stored in the data storage cell to be continuously refreshed and maintained for as many clock cycles as the control signals SELECTI and SELECT2 are both 0.

When the control signals SELECT1 and SELECT2 are binary 0 and 1, respectively, the multiplexer 14 is caused to select the serial input data SERIN coupled to input I1 for coupling through the multiplexer 14 to the line 16 for storage in the data storage cell 12.

When the control signals SELECT1 and SELECT2 are both logic one, then the pipeline transfer data line PIPEIN coupled to input I3 is transferred through the multiplexer 14 to the line 16.

In the preferred embodiment, the signal CLOCK is a two phase clock signal. At each clock pulse in the first phase, the data on line 16 is stored in the data storage cell 12. At each clock pulse of the second phase, the stored data is output on the Q output and the Z output if the Z output is enabled.

A parallel bus called the Z bus (not shown) runs through the array and is used for parallel read and parallel write operations. There are as many conductors in the Z bus as there are columns of cells in the array. Each line of the Z bus is coupled to each of the Z inputs for each cell in the column. Each line of the Z bus corresponding to a particular column of bit storage cell in the array is also coupled to the Z output line of the cell.

The PIPEIN input of each cell is connected to the Q output of the corresponding cell in the same column in the row above in the array.

The detailed circuitry for the preferred form of the data storage cell 12 and the multiplexer 14 is given below.

Figure 2:
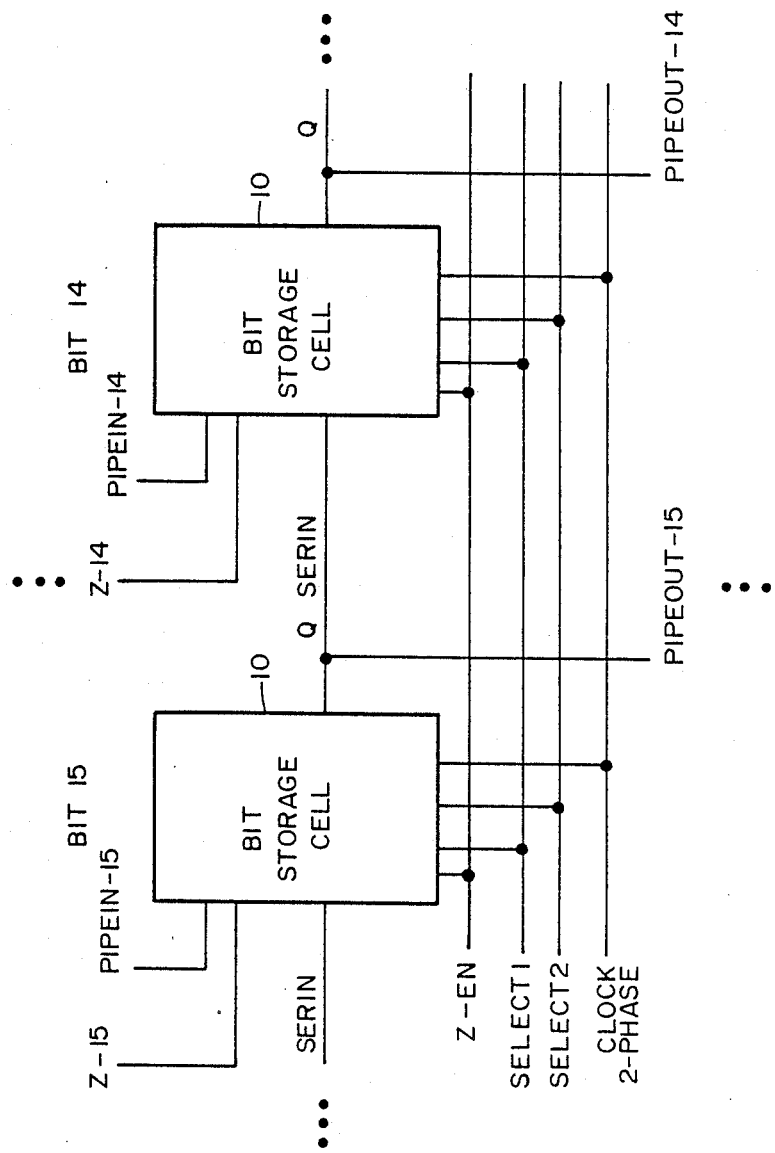
FIG. 2 is a block diagram of a portion of a typical row of an array of cells like that shown in FIG. 1 showing the interconnections therebetween.

A typical row structure in the array is shown in FIG. 2. Note that the Q output of each bit storage cell in the row is coupled to the serial data input SERIN of the next bit storage cell to the right. All control signals Z-EN, SELECT1, SELECT2 and the CLOCK signals are tied together and shared by all bit storage cell in the row. The Z output for each cell is the same line as the parallel format data input line.

The bit storage cell on the left in FIG. 2 has been designated the bit 15 cell and is in column 15 of the array. The bit 15 line of the parallel data bus Z is shown as the line Z-15. Likewise, the bit storage cell on the right in FIG. 2 has been designated the bit 14 cell and is in column 14 of the array. The bit 14 line of the Z bus is designated Z-14, and is shared by the Z output and the parallel data input of the bit 14 storage cell. For a parallel format load operation of this particular row, control circuitry (not shown) would decode the address of this row from address bits sent to the control circuitry and generate the control signals SELECT1 and SELECT2 such that the multiplexer in each bit storage cell in this row would select the Z bus lines as the data sources (marked Z in FIG. 1) for data to be stored in the cell.

The manner in which the structure of FIG. 2 can be used to do a data format change operation involving parallel input and serial output is as follows. First, the control signals SELECT1 and SELECT2 are driven so as to cause all bit storage cells in the row to select the Z inputs for storage. This causes the bit 15 storage cell to select and store the data on the Z-15 input line and causes the bit 14 storage cell to store the data on the Z-14 input line and so on for all bit storage cells in the row as noted above. Typically, 16-bit storage cells will be coupled together to form one row of the array, but this can be extended to any word size, such as 32 bits or 64 bits, etc.

During the process of parallel loading, the control signal Z-EN is driven so as to tri-state the Z output of the cell shown in FIG. 1 such that the input data is not driven into the output of the bit storage circuitry within the cell. That is, in FIG. 2, each bit storage cell 10 contains the circuitry shown in FIG. 1 within the line labeled 10 in FIG. 1. Therefore, the input lines labeled Z-15 and Z-16 are internally connected not only to the parallel data input marked Z in FIG. 1 but also to the Z output of the bit storage circuitry through a tri-state enable circuit (not shown). The control signal Z-EN causes this tri-state enable circuit to isolate the Z output of the bit storage circuitry from the Z input line.

After the parallel load operation, the control signals SELECT1 and SELECT2 are changed so that each bit storage cell 10 selects its serial input line SERIN as the data source for data to be stored. Clock pulses then cause the data to be shifted to the right. Thus, the serial output portion of the parallel-in/serial-out format change operation occurs as follows. Each clock pulse of the first phase clock signal causes each bit storage cell 10 to load and store the bit on the serial input line SERIN coupled to the Q output of the neighboring bit storage cell 10 on the left. Each clock pulse in the second phase of the clock signal causes each bit storage cell 10 to clock the stored bit out to the Q output of the cell and to hold it there for a short time. This time is sufficient for the bit storage cell 10 to the right to load this bit during the next clock pulse of the first phase of the next clock cycle. Thus, the parallel data originally loaded into the row of bit storage cells shifts serially to the right in phase with the clock cycles with a one bit shift to the right occurring during each clock cycle.

The manner in which the row of bit storage cells in FIG. 2 may be operated to perform a serial-input and parallel-output format change operation is as follows. First, the control signals SELECT1 and SELECT2 are driven so as to cause each bit storage cell 10 to select the serial input line SERIN as the data source for loading. Then the serial data word which is to have its format changed is presented one bit at a time on the serial input line SERIN of the bit 15 bit storage cell. As the two-phase clock cycles occur, the individual bits of the input word are shifted in to the various bit storage cells in the row. If the row is 16-bit storage cells long, after 16 clock cycles have occurred, all 16 bits of the input word will have been loaded into the row such that bit 15 will reside in the bit 15 bit storage cell and bit 0 will reside in the bit 0 bit storage cell.

Parallel output of this stored word can then occur by driving the control signal Z-EN so as to enable the Z output of each data storage cell. This will cause the bit 15 bit storage cell to drive bit 15 of the stored word onto the shared Z bus line labeled Z-15. Likewise, the bit 14 bit storage cell will drive bit 14 of the stored word onto the shared Z bus line labeled Z-14.

A serial input operation with a serial output operation delayed by one or any multiple of one clock cycle may be performed as follows. First, the serial loading operation is performed as described above. Then, the SELECT1 and SELECT2 control signals are driven such the multiplexer 14 in each bit storage cell 10 (see FIG. 1) is caused to select the I0 input port coupled to the recirculation line RECIRC for coupling to the line 16. This condition is maintained for as many multiples of one clock cycle as desired to implement the desired delay. As each clock cycle occurs, each bit storage cell 10 outputs the stored bit through the multiplexer 14 and the line 16 back into the input of the data storage cell 12. Thus, the stored bit in each bit storage cell stays constant for as long as the control signals SELECT1 and SELECT2 remain in this binary state. When the desired number of clock cycles have passed, the control signals SELECT1 and SELECT2 are driven to a state to cause each multiplexer 14 in each bit storage cell 10 to select the I1 input connected to the serial input line SERIN. This condition of the control signals SELECT1 and SELECT2 is maintained for the required number of clock cycles to cause the bits stored in all bit storage cells 10 of the row to be shifted to the right and out the Q output of the last bit storage cell 10 in the row.

Note that the recirculation signal line labeled RECIRC in FIG. 1 allows any cell or group of cells to be used essentially as RAM or a shifting network with variable delay.

Figure 3:
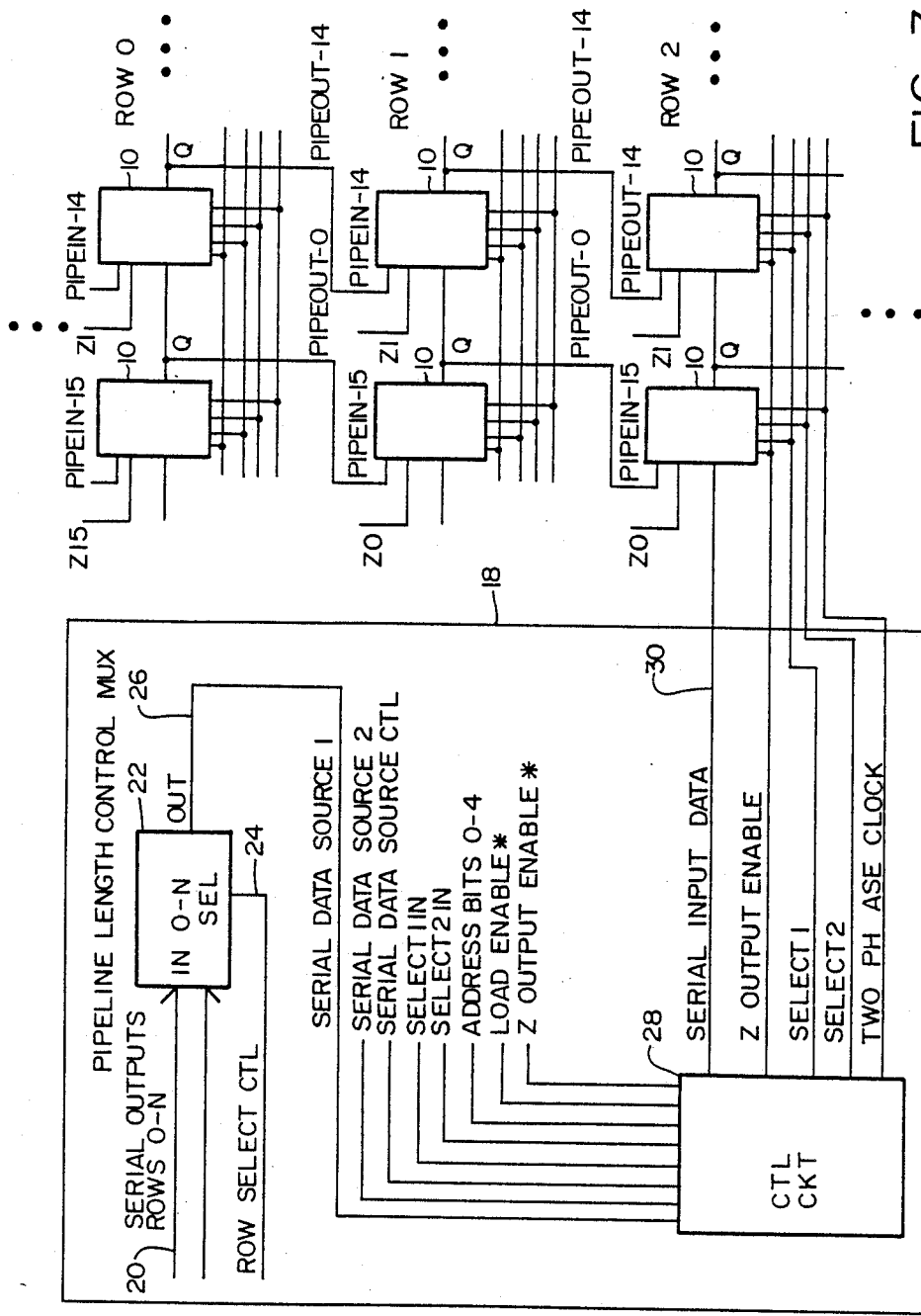
FIG. 3 is a block diagram showing portions of 10 three rows and two columns in an array of cells of the type shown in FIG. 1.

Pipeline operations can be better explained after description of the structure of the overall array. FIG. 3 shows the structure of a portion of the array.

Referring to FIG. 3 there is shown a typical array structure comprised of multiple rows and multiple columns of bit storage cells of the type shown in FIG. 1. Each row of the array has the structure shown in FIG. 2. Only 3 rows and 2 columns are shown in the sample array of FIG. 3, but the size of the array can be extended to any desired number of rows and columns. The columns shown are for bits 15 and 14 and rows 0 through 2. FIG. 3 illustrates how the PIPEOUT output line from each cell (PIPEOUT and the Q output of each cell are the same line) in each row is coupled to the PIPEIN input of the corresponding cell in the same column in the row below.

Also, each row has at the serial input edge (bit 15) thereof a control circuit of which the control circuit shown enclosed by box 18 is typical. This control circuit serves to generate the control signals SELECT1 and SELECT2 and the Z output bus enable signal Z-EN as well as the two phase clock signals. The control circuit 18 also serves to select from multiple serial data sources and apply them to the serial data input of the first bit storage cell in the corresponding row.

For serial-to-parallel conversions or other serial loading of words from sources other than another row in the array, the input serial format data is applied on the input line labeled SERIAL DATA SOURCE 2. Where two or more rows are to be serially combined to create storage for a longer word or to form a single stage of a pipeline, a multiplexer controlling a serial data input line SERIAL DATA SOURCE 1 is used.

For pipeline operations and to achieve variable lengths of delay, it is possible to dynamically reconfigure the array such that the serial output of any row can be applied to the serial input of any other row. To accomplish this, the serial outputs from each row in the array are collected in a bus 20 which has each line thereof coupled to one of multiple data inputs of a multiplexer 22. To configure the array into one or more variable length pipelines, the ROW SELECT control signals on a bus 24 may be manipulated such that the serial output of the last bit storage cell of any selected row can be coupled to the serial input of any other selected row. These two rows then combine to form the first stage in a pipeline. The second stage of the pipeline will be the two rows adjacent to and below the two selected rows which were combined to form the first stage. For example, if row 0 and row 2 in FIG. 3 were serially coupled together to form the first stage of a pipeline, the second stage would be rows 1 and 3 (row 3 is not shown).

To implement such a pipeline, the multiplexer 22 would be manipulated b-y the ROW SELECT CTL signals to select the Q output of the last bit storage cell in row 0 for coupling to the SERIAL DATA SOURCE 1 line 26. The selected serial output is then coupled to the serial data line 26 and becomes the data source for application through the control circuit 28 to the serial data input SERIN of the bit 15 storage cell of row 2.

The control circuit 28 also receives other control signals such as SELECT1IN and SELECT2IN which are manipulated to generate the control signals SELECT1 and SELECT2. Address bits 0–4 select the row being addressed, and the signals LOAD ENABLE* and Z OUTPUT ENABLE* are active low signals to enable loading by the Z bus and output by the Z bus.

By suitable manipulation of the various control signals, it is also possible to have serial input to a row of the array followed by pipelined parallel transfers between rows of the array and ending with serial output from the last stage in the pipeline.

Pipeline operations are useful in bit serial arithmetic for synchronization purposes and for streamlining of mathematical calculations. The manner in which pipeline operations are performed in an array having a structure such as shown in FIG. 3 is as follows. With the array structure shown in FIG. 3, there are several modes of operation. First, pipeline operations may be performed with parallel-load operations followed by parallel-shift operations followed by parallel-output or serial-output operations. Alternatively, pipeline operations may be performed with serial data transfer loading operations followed by parallel data transfer pipeline shifts, followed by either serial or parallel output operations from the final stage in the pipeline. It is also possible to perform a serial load into the first stage of the pipeline followed by serial transfers between pipeline stages and serial output from the last stage in the pipeline.

For purposes of illustration, assume that parallel load followed by parallel pipeline shift followed by parallel output pipeline operations are to be performed. The first step in this process is a parallel load. Assuming that the first stage in the pipeline is row 0, the control circuit for row 0 (not shown) causes the Z output enable control signal to be driven so as to isolate the Z bus from the output of the bit storage circuitry. The control signals SELECT1 and SELECT2 are then driven so as to select the lines of the Z bus as the data sources for the bit storage cells along the row. The data on the Z bus is then parallel loaded into the row. The data in the first stage of the pipeline may then be maintained in a static state for as many clock cycles as necessary by driving the control signals SELECT1 and SELECT2 to recirculate the data in each bit storage cell in the row. Alternatively, the data in the first row of the pipeline may be shifted in parallel to the next stage or row of the pipeline on the next clock cycle. This may be done by driving the control signals SELECT1 and SELECT2 such that the multiplexer 14 in each bit storage cell (see FIG. 1) selects the I3 input coupled to the input line PIPEIN during the interval during which the data from the row above is being held on the Q/PIPEOUT output lines. All the rows or stages of the pipeline involved in such a pipeline shift have their control signals SELECT1 and SELECT2 driven to the same logic state. Thus, on each clock cycle, the data at the Q output of all bit storage cells in a particular row is parallel shifted and loaded into the corresponding bit storage cells of the corresponding column of the next row down in the array.

For example, assume that the word size is 16 bits and there are 16 bit storage cells in each row and 3 stages in the pipeline comprising rows 0, 1 and 2. On the first clock cycle, the first word will be parallel loaded from the Z bus into row 0. Then on clock cycle 2, the first word residing in row 0 will be parallel loaded into row 1 and a second word will be loaded into row 0. On clock cycle 3, the first word will be loaded into row 2, the second word will be loaded into row 1 and a third word will be loaded into row 0. Those skilled in the art will appreciate that the references to clock cycles in this illustration is figurative, and, in fact, it may take some multiple of an actual clock cycle for an actual parallel shift or load operation because of propagation delays in the addressing and control signal generation circuitry of control circuit 18. Parallel shift operations between rows may occur in one clock cycle. However, access to data via the Z bus requires multiple clock cycles.

Once the data has reached the last stage in the pipeline, the data may then be output either in parallel or serial format. If the data is to be output in parallel format, the Z-EN output enable control signal is driven so as to enable the Z output lines for all bit storage cells in the last row or stage of the pipeline. Alternatively, the data from the last stage of the pipeline may be output in serial format in the manner described above by driving the control signals SELECT1 and SELECT2 such that each cell in the row selects its serial data input line, thereby loading the data at the output from the bit storage cell on the left of the cell.

Other types of pipeline delay operations may also be performed. For example, the data may be loaded into the first stage of the pipeline in serial fashion. This is done in the manner described above for serial-to-parallel data format change operations. Then, parallel transfers from one stage of the pipeline to the next stage are performed in the manner described previously. As each word of data reaches the final stage in the pipeline, it may be output in either parallel or serial format in the manner described above.

Figure 4:
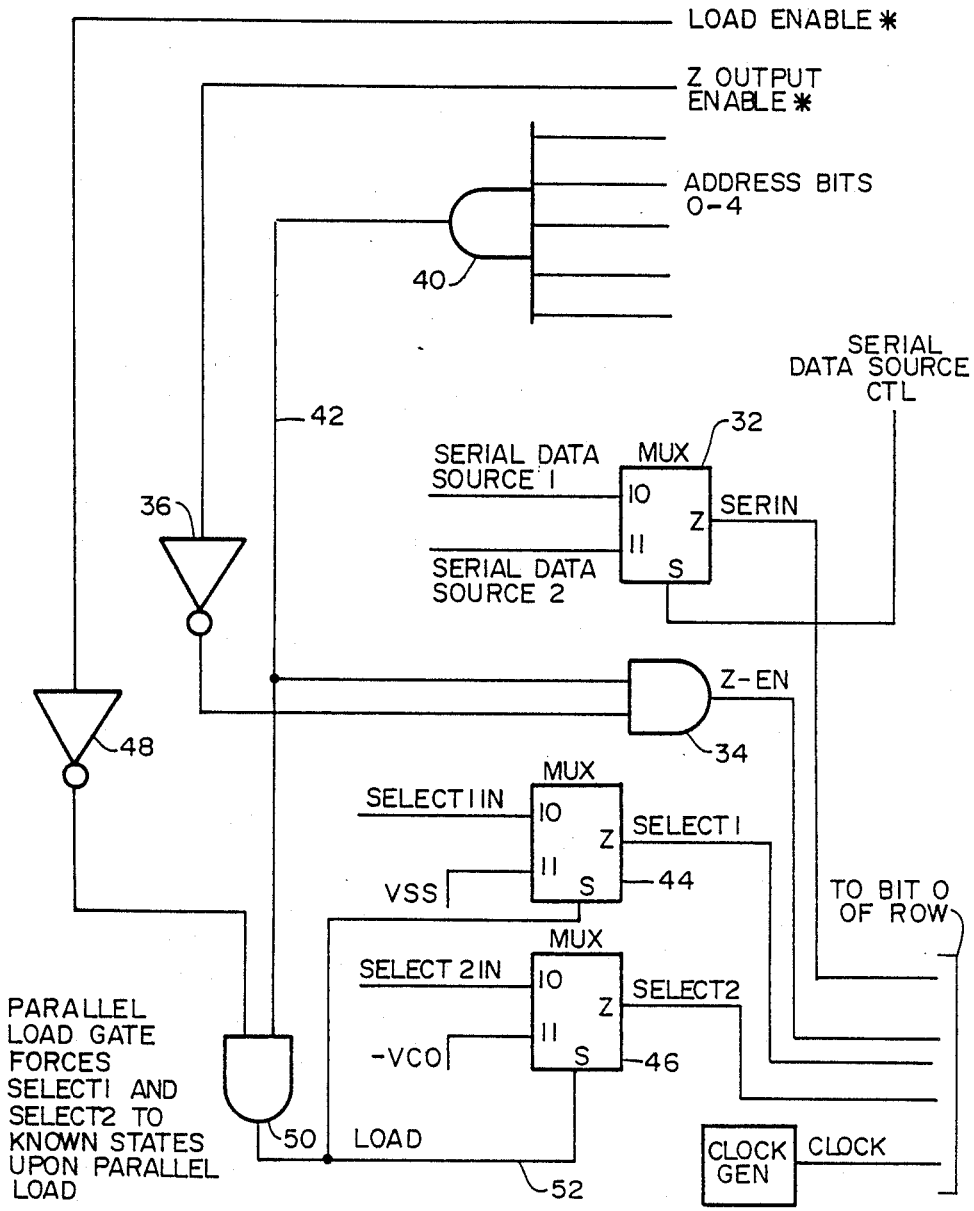
FIG. 4 is a block diagram of a typical embodiment of the circuitry of the control circuit 28 in FIG. 3.

Referring to FIG. 4, there is shown one embodiment of the control circuitry inside the control circuit 28 of FIG. 3. A multiplexer 32 selects between SERIAL DATA SOURCE 1 and SERIAL DATA SOURCE 2 under the control of the SERIAL DATA SOURCE CTL input signal, and couples the selected data line to the serial input line SERIN for the corresponding row.

An AND-gate 34 and an inverter 36 combine to generate the Z output enable signal Z-EN. This signal is activated when a parallel read operation to load data from all the bit storage cells of a row onto the Z bus is desired. A parallel read operation is initiated by activation of the input control signal Z OUTPUT ENABLE* and addressing of the row coupled to the control circuit 28 by the setting of a predetermined binary state for the address bit lines 0–4 coupled to the AND-gate 40. When these address lines are in a binary state indicating that this row is being addressed, and the Z OUTPUT ENABLE* control signal is activated, a parallel read operation is possible because the AND gate 34 will cause the Z output to leave the high impedance, isolated state and load the contents of each cell in the addressed row onto the Z bus.

The multiplexers 44 and 46 normally select the input control signals SELECT1IN and SELECT2IN for application to the control signal lines SELECT1 and SELECT2 coupled to the appropriate control signal inputs of all cells in the row. Thus, by manipulating the input signals SELECT1IN and SELECT2IN the recirculation, pipeline input and serial data input modes may be selected.

The fourth possibility of the binary states of the control signals SELECT1IN and SELECT2IN is reserved for parallel load operations and may be forced at any time regardless of the states of the controls signals SELECT1IN and SELECT2IN. This forcing occurs whenever the output from AND gate 40 indicates that this row is being addressed and the control signal LOAD ENABLE* is active. The occurrence of these two conditions causes the inverter 48 and the AND-gate 50 to activate the LOAD control signal on line 52. This forces both of the multiplexers 44 and 46 to select their inputs labeled I1. These inputs are coupled to the VSS and VCO power supply lines. This forces the control signals SELECT1 and SELECT2 to the multiplexers 14 in each bit storage cell (see FIG. 1) to select the Z bus line as the data source for the data to be loaded into each cell. This mode of operation makes the array look like a RAM.

The bit serial loading operations above are useful for interfacing with the inputs and outputs of bit serial multipliers.

Figure 5:
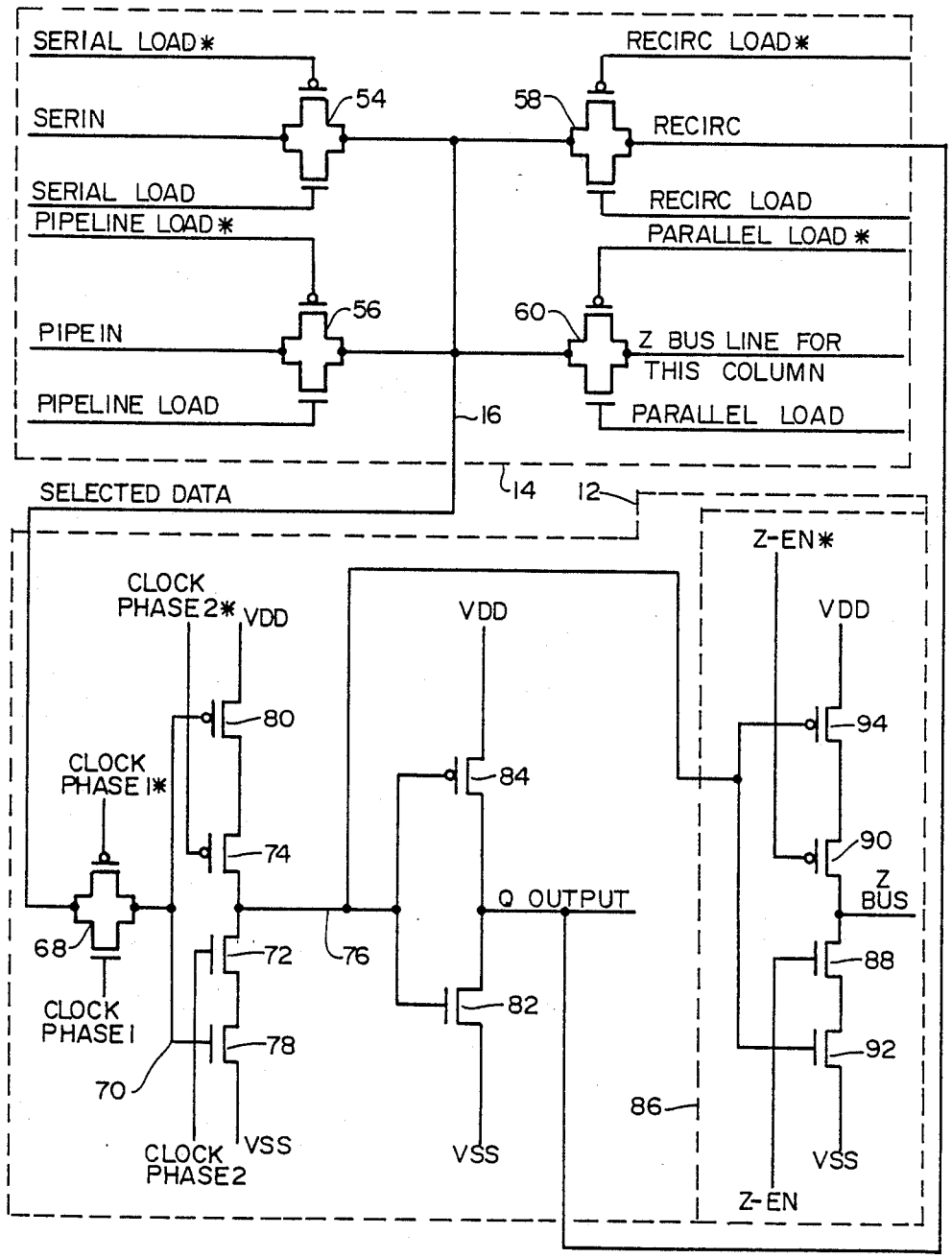
FIG. 5 is a circuit diagram of a CMOS embodiment of a memory cell of the type shown in FIG. 1.

Referring to FIG. 5, there is shown a schematic diagram for the circuitry for the bit storage cell of FIG. 1 as implemented in CMOS. The multiplexer 14 is comprised of four CMOS transmission gates 54, 56, 58 and 60. Transmission gate 54 controls the coupling of the serial input line SERIN to the data input line 16 of the data storage cell 12. Two control signals, SERIAL LOAD and SERIAL LOAD*, control this coupling. When the control signal SERIAL LOAD is active high and the control signal SERIAL LOAD* (an asterisk after a control signal name means the signal is active low and no asterisk means the signal is active high) is active low, then the serial data input line SERIN is coupled to the main data input line 16. The control signals SERIAL LOAD and SERIAL LOAD* are generated by a decoder (not shown) from one of the four distinct binary possibilities for the input control signals SELECT1 and SELECT2 (also not shown) from the control circuit 28 of FIG. 4.

The transmission gate 56 controls coupling of the pipeline data input line PIPEIN to the main data input line 16. Two control signals, PIPELINE LOAD and PIPELINE LOAD*, control this coupling. These control signals are generated by the same decoder mentioned above. When the control signal PIPELINE LOAD is active high and the control signal PIPELINE- LOAD* is active low, the pipeline data input line PIPEIN is coupled to the main data input line 16, and the data storage cell will store whatever data appears on PIPEIN.

Similar operations occur by transmission gates 58 and 60. When the control signal RECIRC LOAD is active high and the control signal RECIRC LOAD* is active low, the recirculation line RECIRC is coupled to the main data input line 16, thereby allowing the bit storage cell to maintain the contents of its data constant over one or more clock cycles. Likewise, for transmission gate 60, when the control signal PARALLEL LOAD is active high and the control signal PARALLEL LOAD* is active low, the Z bus line connected to the particular column in which the bit storage cell resides will be coupled to the main data input line 16.

A transmission gate 68 controls coupling between the above mentioned transmission gates and the data storage cell 12. The transmission gate 68 is controlled by the first-phase clock signal CLOCK PHASE1. When the CLOCK PHASE1 signal is active high, the CLOCK PHASE1 signal will be active low, and the transmission gate 68 will couple the data on the main data line 16 through to a line 70. In integrated form, this line 70 has a capacitance which is large enough to temporarily store the data on line 16 in the same manner that the capacitance in a dynamic RAM cell stores data.

The data storage cell 12 also includes one clocked inverter, one unclocked inverter and a tri-state output enable circuit driving the Z output. The clocked inverter circuit is comprised of the MOS transistors 72, 74, 78 and 80. The clocking is done by transistors 72 and 74 which are controlled by the second phase clock signals CLOCK PHASE2 and CLOCK PHASE2. When the CLOCK PHASE2 signal is active high, and the CLOCK PHASE2 signal is active low, the NMOS transistor 72 and the PMOS transistor 74 are turned on. This condition for transistors 72 and 74 drives whatever data is stored on the capacitance of line 70 through in inverted binary form to the line 76. The NMOS transistor 78 and the PMOS transistors 80 comprise the inverter part of the clocked inverter. If the bit stored in the capacitance of line 70 is a logic one (+5 volts), the NMOS transistor 78 is turned on and the PMOS transistor 80 is turned off, thereby coupling the voltage source VSS (0 volts or ground) to the line 76. Conversely, if the bit on line 70 is a logic 0 (0 volts), the voltage source VDD is coupled to line 76.

Line 76 has its own capacitance and is coupled to the gates of MOS transistors 82 and 84, which, together, comprise the unclocked inverter of the data storage cell 12. This inverter inverters whatever binary information is stored on line 76 and drives it onto the Q OUTPUT line. When line 76 is at the voltage level of the source VSS (logic 0), the NMOS transistor 82 will be turned off, and the CMOS transistor 84 will be turned on thereby coupling the Q OUTPUT line to the voltage source VDD (+5 volts or logic 1) Conversely, if the data stored on the capacitance of line 76 is a logic 1, then the PMOS transistor 84 will be turned off and NMOS transistor 82 will be turned on. This couples the voltage source VSS to the line Q OUTPUT line.

The Z BUS output line (Z-0, Z-1, etc. depending upon the column) is driven by an enable/driver circuit comprised of the MOS transistors 88, 90, 92 and 94. When the control signal Z-EN is active high, and the control signal Z-EN* is active low, the NMOS transistor 88 and the PMOS transistor 90 will both be turned on. This causes the Z BUS output line to become active and be driven by the action of the NMOS transistor 92 and the PMOS transistor 94. Because the gates of the transistors 92 and 94 are coupled to the line 76, as are the gates of the transistors 82 and 84, the transistors 92 and 94 mirror the functions of the transistors 82 and 84, respectively. Therefore, the Z BUS output line will be a logic 1 whenever the Q output is a logic 1, and will be logic 0 whenever the Q output is logic 0.

Although the invention has been described in terms of the preferred. and alternative embodiments disclosed herein, those skilled in the art will appreciate various modifications which can be made to the teachings of the invention without departing from the spirit and scope of those teachings. All such modifications are intended to included within the scope of the claims appended hereto.

What is claimed is:

1. An apparatus for storing data, comprising:
a memory cell for storing a bit of digital data, said memory cell having an input for receiving data to be stored in said cell, a first output for providing an access path to data stored in said cell, and a second output for providing an access path to data stored in said cell;
a multiplexer having a plurality of data inputs for receiving data, one of said plurality of data inputs coupled to said second data output and another of said data inputs coupled to said first data output, and having a data output coupled to said data input of said memory cell, and having a plurality of control inputs for receiving a plurality of control signals controlling which of said plurality of data inputs is coupled to said data output; and
means coupled to said second data output and having a control signal input for receiving an output enable signal, for electrically isolating any conductor coupled to said second data output from said memory cell upon activation of said output enable signal.

2. A memory cell array comprising:
a plurality of bit storage means for storing bits of digital data and arranged into rows and columns, each bit storage means comprising:
a memory cell for storing a bit of digital data, said memory cell having an input for receiving data to be stored in said cell, a first data output for providing an access path to data stored in said cell, and a second data output for providing an access path to data stored in said cell;
a multiplexer having a serial data input, a parallel data input, a recirculation data input and a pipeline data input for receiving data, said recirculation data input being coupled to said first data output, said parallel data input being coupled to said second data output, and having a data output coupled to said data input of said memory cell, and having a plurality of control inputs for receiving a plurality of control signals controlling which of said plurality of data inputs is coupled to said data output; and means coupled to said second data output and having a control signal input for receiving an output enable signal, for electrically isolating any conductor coupled to said second data output from said memory cell upon activation of said output enable signal; wherein said first data output of each said bit storage means is coupled to said pipeline data input of the corresponding bit storage means in the same column in the row below, and wherein said first data output of each said bit storage means is also coupled to said serial data input of an adjacent bit storage means in the same row, and wherein said parallel data inputs and said second data outputs for all bit storage means in the same column are coupled together, and wherein said control signal inputs for receiving said output enable signal and other control signals for all said bit storage means in the same row are coupled together.

3. The apparatus of claim 2 further comprising a plurality of control means each coupled to said serial data input and said plurality of control inputs of a bit storage means at the end of a corresponding row of said array and having a plurality of serial data inputs and a plurality of control inputs, each said control means for selecting one of a plurality of serial data sources for coupling to said serial data input of said row of bit storage means and for generating said plurality of control signals and said output enable so as to provide a plurality of modes of operation of said array.

4. The apparatus of claim 3 wherein each said control means includes means for generating said plurality of control signals such that any said row of said array may load data serially and output the same data in parallel format.

5. The apparatus of claim 3 wherein each said control means includes means for generating said plurality of control signals such that any said row of said array may load data in parallel format and output the data in serial format.

6. The apparatus of claim 3 wherein each said control means includes means for generating said plurality of control signals such that any said row of said array may load data in parallel format through said pipeline data input and such that the data so loaded may be output either serially from said first output of a bit storage means at the end of said row or loaded in parallel format into an adjacent row of said array through said pipline data input of said adjacent row.

7. The apparatus of claim 3 wherein each said control means includes means for generating said plurality of control signals such that any said row of said array may load data in parallel format through said pipeline data input and such that the data so loaded may be output either serially from said first output of a bit storage means at the end of said row or loaded in parallel format into an adjacent row of said array through said pipline data input of said adjacent row and may be output serially from said first output of a bit storage means at the end of said adjacent row.

8. The apparatus of claim 3 wherein each said control means includes means for generating said plurality of control signals such that any said first row of said array may load data in parallel format through said pipeline data input and such that the data so loaded may be output either serially from said first output of a bit storage means at the end of said row or loaded in parallel format into an adjacent second row of said array through said pipline data input of said adjacent row and may be output serially from said first output of a bit storage means at the end of said adjacent row or output in parallel format from said second outputs of all said bit storage means in said second row.

9. The apparatus of claim 3 wherein each said control means includes means to partition the available rows of said array into one or more pipelines each comprised of a selected number of parallel data format coupled stages, each said stage comprising one or more rows of said array, and further comprises means in said control means for generating said control signals such that any first stage in any of said one or more pipelines may be loaded with data in either parallel format or serial format, and such that any last stage of any of said one or more pipelines may output data in either serial or parallel data format.

10. A memory cell comprising:

first, second, third and fourth CMOS transmission gates, each having a data input and a data output and having two control signal inputs for receiving control signals which control whether said transmission gate couples said data input to said data output, and wherein said data outputs of all said transmission gates are coupled together and wherein said data inputs of said first through fourth transmission gates are for serial format data, pipeline parallel format data, recirculated data and parallel format input data, respectively;

a clocked CMOS transmission gate having a data input coupled to said data outputs of said first through fourth transmission gates and having a data output having a capacitance, and having first and second control inputs for receiving, respectively, the clock pulses and inverse clock pulses of the first phase of a two phase clock signal for storing the data at said data input of said clocked CMOS transmission gate in said capacitance of said data output when said first phase clock signal is in a predetermined logic state;

a clocked CMOS inverter having a data input coupled to said data output of said clocked CMOS transmission gate and having a data output, and having two control signal inputs for receiving the clock pulses and inverted clock pulses of the second phase of said two phase clock signal, said clocked inverter for sensing the voltage on the capacitance of said data output of said clocked CMOS transmission gate when said clock pulses of said second phase of said two phase clock cycle are in a predetermined logic state and for driving said data output of said clocked CMOS inverter to a predetermined logic state related to the logic state of said capacitance of said clocked CMOS transmission gate data output;

a CMOS inverter having a data input coupled to said data output of said clocked CMOS inverter and having a data output;

a CMOS inverter having first and second control signal inputs, a data input and having a data output which may be electrically isolated from said data input upon receipt of appropriate control signals at said first and second control signal inputs.

11. An array of memory cells, comprising:

a plurality of bit storage cells arranged into rows and columns where each said bit storage cell comprises:

first, second, third and fourth CMOS transmission gates, each having a data input and a data output and having two control signal inputs for receiving control signals which control whether said transmission gate couples said data input to said data output, and wherein said data outputs of all said transmission gates are coupled together and wherein said data inputs of said first through fourth transmission gates are for serial format data, pipeline parallel format data, recirculated data and parallel format input data, respectively;

a clocked CMOS transmission gate having a data input coupled to said data outputs of said first through fourth transmission gates and having a data output having a capacitance, and having first and second control inputs for receiving, respectively, the clock pulses and inverse clock pulses of the first phase of a two phase clock signal for storing the data at said data input of said clocked CMOS transmission gate in said capacitance of said data output when said first phase clock signal is in a predetermined logic state;

a clocked CMOS inverter having a data input coupled to said data output of said clocked CMOS transmission gate and having a data output, and having two control signal inputs for receiving the clock pulses and inverted clock pulses of the second phase of said two phase clock signal, said clocked inverter for sensing the voltage on the capacitance of said data output of said clocked CMOS transmission gate when said clock pulses of said second phase of said two phase clock cycle are in a predetermined logic state and for driving said data output of said clocked CMOS inverter to a predetermined logic state related to the logic state of said capacitance of said clocked CMOS transmission gate data output;

a CMOS inverter having a data input coupled to said data output of said clocked CMOS inverter and having a data output;

an electrically controllable output isolation CMOS inverter having first and second control signal inputs, a data input and having a data output which may be electrically isolated from said data input upon receipt of appropriate control signals at said first and second control signal inputs.

wherein data input of said first CMOS transmission gate of each bit storage cell in each row of said array is coupled to said data output of said CMOS inverter of the bit storage cell on the left in the same row, and wherein said data output of said CMOS inverter of each said bit storage cell in coupled to said data input of said second CMOS transmission gate of the bit storage cell in an adjacent row in the same column of said array, and wherein said data output of said CMOS inverter is coupled to said data input of said third CMOS transmission gate.

12. An apparatus according to claim 11 further comprising a plurality of control means, each said control means coupled to said control signal inputs of said first through fourth CMOS transmission gates and to said control signal inputs of said electrically controllable output isolation CMOS inverter and to said control inputs for receiving the clock pulses and the inverted counterparts of the clock pulses of both said first and second phases of said clock signal for each bit storage cell in a particular row of said array, said control means for generating said two phase clock signals and said other control signals such that each row in said array may operate in any of a plurality of modes.

13. The apparatus of claim 12 wherein each said control means includes means to allow the data output of said first CMOS transmission gate of the first bit storage cell in the corresponding row to be selectively coupled to the data output of said CMOS inverter of the last bit storage cell of any row of said array.

14. The apparatus of claim 12 wherein each said control means includes means to allow the rows of said array to be coupled together as stages in one or more pipelines, where each stage in said pipeline is comprised of one or more rows of said array.

15. The apparatus of claim 12 wherein each said control means includes means for generating said control signals such that any row of said array can load data in serial format and output data in parallel format or load data in parallel format and output data in serial format.

16. The apparatus of claim 12 wherein each said control means includes means for generating said control signals such that any row or rows of said array may act as the first stage of a multistage pipeline with a selectable number of rows adjacent to the row or rows selected as said first stage acting as the intermediate and final stages of said pipeline.

17. The apparatus of claim 16 wherein each said control means includes means to generate said control signals such said first stage of said pipeline can load data to traverse said pipeline in either serial or parallel format and such that the final stage of said pipeline can output data in either parallel or serial format.

18. The apparatus of claim 17 wherein each said control means includes means to generate control signals such that data transfers between stages of said pipeline may occur in parallel or serial format.

* * * * *